(12) United States Patent
Littau et al.

(10) Patent No.: US 8,075,789 B1
(45) Date of Patent: Dec. 13, 2011

(54) REMOTE PLASMA CLEANING SOURCE HAVING REDUCED REACTIVITY WITH A SUBSTRATE PROCESSING CHAMBER

(75) Inventors: Karl A. Littau, Palo Alto, CA (US); Chiliang L. Chen, Cupertino, CA (US); Anand Vasudev, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 423 days.

(21) Appl. No.: 08/893,917

(22) Filed: Jul. 11, 1997

(51) Int. Cl.
*C25F 1/00* (2006.01)
*C25F 3/30* (2006.01)
*C25F 5/00* (2006.01)
*B44C 1/22* (2006.01)
*C03C 15/00* (2006.01)
*C03C 25/68* (2006.01)
*C23F 3/00* (2006.01)

(52) U.S. Cl. ............... 216/63; 216/67; 134/1.1
(58) Field of Classification Search .......... 219/121.43; 156/643, 345.36, 345.35; 118/723 M; 134/1.1; 216/63, 67
See application file for complete search history.

(56) References Cited

U.S. PATENT DOCUMENTS

| | | | |
|---|---|---|---|
| 4,529,474 A | 7/1985 | Fujiyama et al. | 156/643 |
| 4,657,616 A | 4/1987 | Benzing et al. | 156/345 |
| 4,874,723 A | 10/1989 | Jucha et al. | |
| 4,888,199 A * | 12/1989 | Felts et al. | 427/10 |
| 5,018,479 A * | 5/1991 | Markunas et al. | 118/723 IR |
| 5,129,958 A | 7/1992 | Nagashima et al. | 134/22.1 |
| 5,158,644 A | 10/1992 | Cheung et al. | 156/643 |
| 5,211,796 A | 5/1993 | Hansen | 156/345 |
| 5,302,803 A * | 4/1994 | Stevens et al. | 219/121.43 |
| 5,328,558 A * | 7/1994 | Kawamura | 156/643 |
| 5,401,358 A | 3/1995 | Kadomura | 156/651 |
| 5,403,434 A * | 4/1995 | Moslehi | 156/643 |
| 5,411,591 A * | 5/1995 | Izu et al. | 118/718 |
| 5,413,670 A | 5/1995 | Langan et al. | 134/1.2 |
| 5,451,259 A | 9/1995 | Krogh | 118/723 MR |
| 5,454,903 A | 10/1995 | Redeker et al. | 216/67 |
| 5,474,615 A | 12/1995 | Ishida et al. | 134/1.2 |
| 5,491,112 A | 2/1996 | Buchta et al. | 437/225 |
| 5,503,676 A | 4/1996 | Shufflebotham et al. | 118/723 MR |
| 5,611,863 A | 3/1997 | Miyagi | 118/723 MP |
| 5,788,778 A * | 8/1998 | Shang et al. | 134/1 |

FOREIGN PATENT DOCUMENTS

| | | |
|---|---|---|
| EP | 0697467 A1 | 2/1996 |
| EP | 0843347 A2 | 5/1998 |

* cited by examiner

*Primary Examiner* — Rudy Zervigon
(74) *Attorney, Agent, or Firm* — Kilpatrick Townsend & Stockton LLP

(57) ABSTRACT

A method and apparatus for cleaning a chamber in a substrate processing system having less reactivity with the chamber walls and the components contained therein. The method includes mixing a diluent gas with a flow of radicals produced by a plasma remotely disposed with respect to the chamber, at a point located between a plasma applicator and the chamber. The apparatus includes a fluid manifold having multiple inlets and an outlet with the outlet being coupled to an intake port of the chamber. One of the inlets are in fluid communication with the plasma applicator, with the remaining inlets being in fluid communication with a supply of the diluent gas. In this fashion, the diluent gas flow and the flow of reactive radicals mix when traveling between the inlets and the outlet to form a gas-radical mixture egressing from the outlet and traversing through the intake port.

5 Claims, 13 Drawing Sheets

REMOTE PLASMA CLEANING SOURCE HAVING REDUCED REACTIVITY WITH A SUBSTRATE PROCESSING CHAMBER

CROSS REFERENCE TO RELATED APPLICATIONS

This application is related to commonly assigned patent applications entitled "APPARATUS AND METHODS FOR UPGRADED SUBSTRATE PROCESSING SYSTEM WITH MICROWAVE PLASMA SOURCE", filed on Mar. 5, 1997 as application Ser. No. 08/811,627, and having Tsutomu Tanaka, Mukul Kelkar, Kevin Fairbairn, Hari Ponnekanti and David Cheung listed as inventors; "APPARATUS FOR IMPROVED REMOTE MICROWAVE PLASMA SOURCE FOR USE WITH SUBSTRATE PROCESSING SYSTEMS", filed on Apr. 23, 1997 as application Ser. No. 08/839,111, and having Chien-Teh Kao, Kenneth Tsai, Quyen Pham, Ronald L. Rose, Calvin R. Augason, and Joseph Yudovsky listed as inventors (referred to herein as "Kao"); and "METHOD FOR IMPROVED CLEANING OF SUBSTRATE PROCESSING SYSTEMS" filed concurrently herewith as application Ser. No. 08/893,922, and having Chien-Tien Kao, Karl Littau, Anand Vasudev and Dong W. Koo listed as inventors; the disclosures of which are hereby incorporated by reference.

BACKGROUND OF THE INVENTION

The present invention relates to substrate processing. Specifically, the present invention relates to an apparatus and method for cleaning a chamber in a substrate processing system that is less destructive to the chamber walls and the components contained therein and increases the number of wafers that may be processed between wet cleans.

One of the primary steps in the fabrication of modern semiconductor devices is the formation of a layer, such as a metal silicide layer like tungsten silicide ($WSi_x$), on a substrate or wafer. As is well known, such a layer can be deposited by chemical vapor deposition (CVD). In a conventional thermal CVD process, reactive gases are supplied to the substrate surface where heat-induced chemical reactions take place to form the desired film over the surface of the substrate being processed. In a conventional plasma-enhanced CVD (PECVD) process, a controlled plasma is formed using radio frequency (RF) energy or microwave energy to decompose and/or energize reactive species in reactant gases to produce the desired film.

One problem that arises during such CVD processes is that unwanted deposition occurs in the processing chamber and leads to potentially high maintenance costs. With CVD of a desired film on a wafer, undesired film deposition can occur on any hot surface including the heater or process kit parts of the apparatus, because the reactive gases can diffuse everywhere, even between cracks and around corners, in the processing chamber. During subsequent wafer depositions, this excess growth on the heater and/or other parts of the apparatus will accelerate until a continuous metal silicide film is grown on the heater and/or these other parts. Over time, failure to clean the residue from the CVD apparatus often results in degraded, unreliable processes and defective wafers. When excess deposition starts to interfere with the CVD system's performance, the heater and other process kit parts (such as the shadow ring and gas distribution faceplate) can be removed and replaced to remove unwanted accumulations in the CVD system. Depending on which and how many parts need replacing and the frequency of the replacement, the cost of maintaining the substrate processing system can become very high.

In these CVD processes, a reactive plasma cleaning is regularly performed in situ in the processing chamber to remove the unwanted deposition material from the chamber walls, heater, and other process kit parts of the processing chamber. Commonly performed between deposition steps for every wafer or every n wafers, this cleaning procedure is performed as a standard chamber cleaning operation where the etching gas is used to remove or etch the unwanted deposited material. Common etching techniques include plasma CVD techniques that promote excitation and/or disassociation of the reactant gases by the application of RF energy with capacitively-coupled electrodes to a reaction zone proximate the substrate surface. In these techniques, a plasma of highly reactive species is created that reacts with and etches away the unwanted deposition material from the chamber walls and other areas. However, with some metal CVD processes, etching gases useful for etching unwanted metal are often corrosive and attack the materials which make up the chamber, heater, and process kit parts of the processing chamber.

Moreover, use of in situ plasma cleaning also causes ion bombardment of the metallic parts of the CVD apparatus. The ion bombardment makes difficult to effective cleaning of the excess CVD film without damaging the heater and other chamber parts in the cleaning process. Thus, maintaining chamber performance may result in a reduction of the operational life of these components. In addition to such in situ plasma cleaning procedures and occurring far less frequently, a second cleaning procedure involves opening the processing chamber and physically wiping the entire reactor—including the chamber walls, exhaust and other areas having accumulated residue—with a special cloth and cleaning liquids. This cleaning procedure is commonly referred to as a wet clean, due to the liquids employed. Failure to periodically employ a wet clean results in impurities accumulating in the CVD apparatus that which can migrate onto the wafer and cause device damage. Thus, properly cleaning CVD apparatus is important for the smooth operation of substrate processing, improved device yield and better product performance.

As an alternative to in situ plasma cleaning, other conventional CVD apparatus have a separate processing chamber connected to a remote microwave plasma system. Because the high breakdown efficiency with a microwave plasma results in a higher etch rate (on the order of about 2 µm/min) than is obtained with a capacitive RF plasma, these remote microwave plasma systems provide radicals from the remote plasma that can more gently, efficiently and adequately clean the residue without ion bombardment. Yet, the remote microwave plasma system suffers, although to a lesser degree, some of the drawbacks of an in situ plasma cleaning system. Some of the radicals from the remote plasma may react with the components of the chamber, etching the same. As discussed above, this may cause physical damage to the components of the chamber, including the chamber walls, substantially reducing the operational life of the same. In addition, the aforementioned reactions between the chamber components and the radicals leaves a residue on the chamber components which may contaminate wafer surfaces during processing.

What is needed, therefore, is a cleaning method and system for a CVD apparatus that is less destructive to the chamber walls and the components contained within the CVD chamber.

SUMMARY OF THE INVENTION

The present invention provides a method and apparatus for cleaning a chamber in a substrate processing system that is less destructive to the chamber walls and the components contained therein, while increasing the number of wafers that may be processed between wet cleans. The present invention does so by mixing a diluent gas with a flow of reactive radicals produced by a plasma remotely disposed with respect to the chamber, at a point located between a plasma applicator and the chamber. This produces a gas-radical mixture which allows increasing the flow rate of a gas through the chamber, while decreasing the rate at which materials located within the chamber are etched by the reactive radicals dispersed within the gas-radical mixture.

The method of the present invention includes forming a plasma remotely with respect to the chamber; forming, from the plasma, a flow of reactive radicals traversing toward a substrate processing chamber and forming a diluent gas flow. During a mixing step, the flow of reactive radicals is intermixed with the diluent gas flow, anterior to the substrate processing chamber, to form a gas-radical mixture. Thereafter, the gas-radical mixture is flowed into the substrate processing chamber, with the chamber maintained at processing conditions suitable for reactions with the reactive radicals to occur.

The apparatus includes a fluid manifold having multiple inlets and an outlet with the outlet being coupled to an intake port of the chamber. One of the inlets are in fluid communication with the plasma applicator, with the remaining inlets being in fluid communication with a supply of the diluent gas. In this fashion, the diluent gas flow and the flow of reactive radicals mix when traveling between the inlets and the outlet to form a homogeneous gas-radical mixture egressing from the outlet and traversing through the intake port.

These and other embodiments of the present invention, as well as its advantages and features are described in more detail in conjunction with the text below and attached figures.

DETAILED DESCRIPTION OF THE SPECIFIC EMBODIMENTS

I. Exemplary CVD System

Figure 1A:
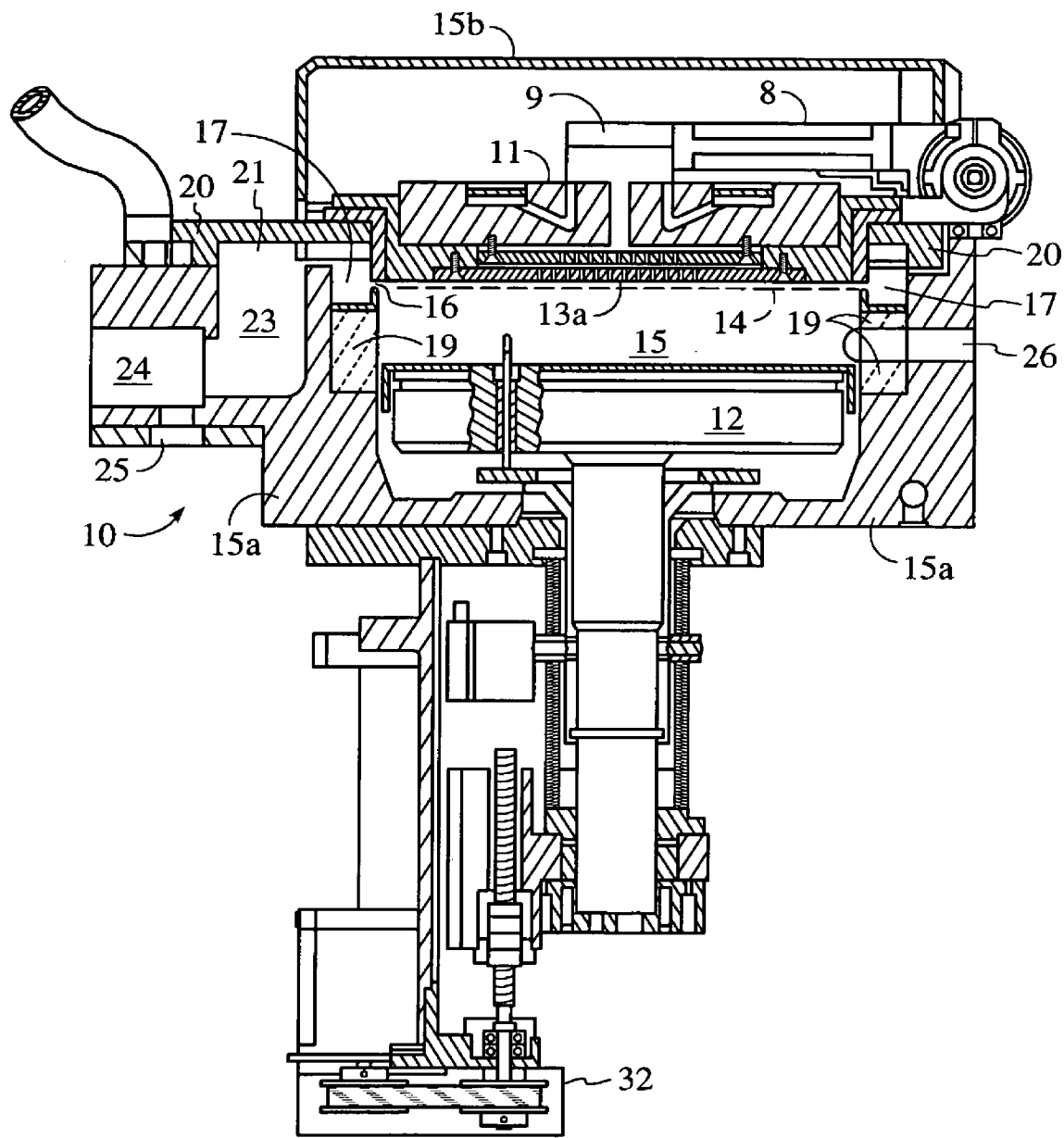
FIGS. 1A and 1B are vertical, cross-sectional views of one embodiment of an exemplary substrate processing apparatus, such as a CVD apparatus, which may be used in accordance with the present invention.
Figure 1B:
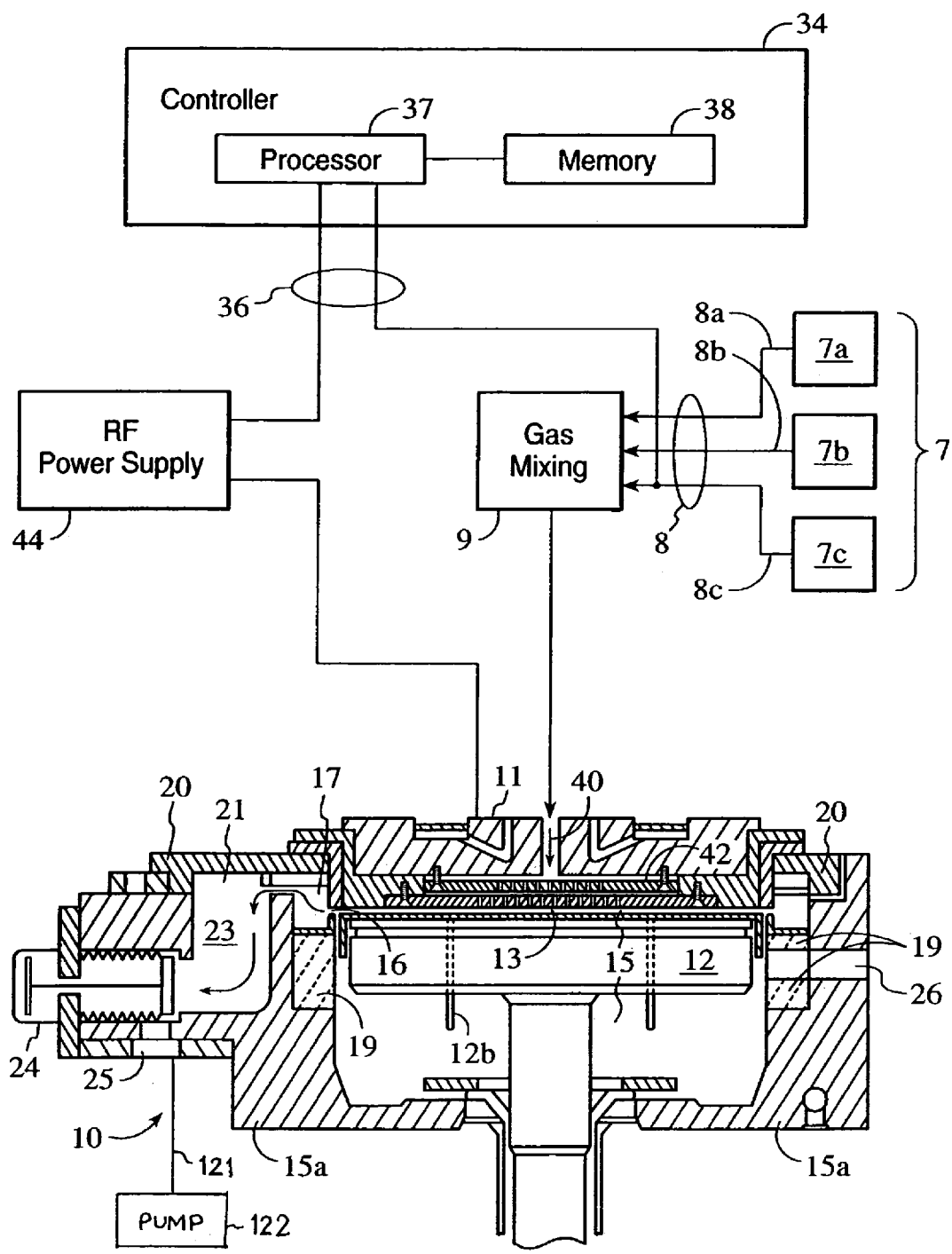
Figure 1C:
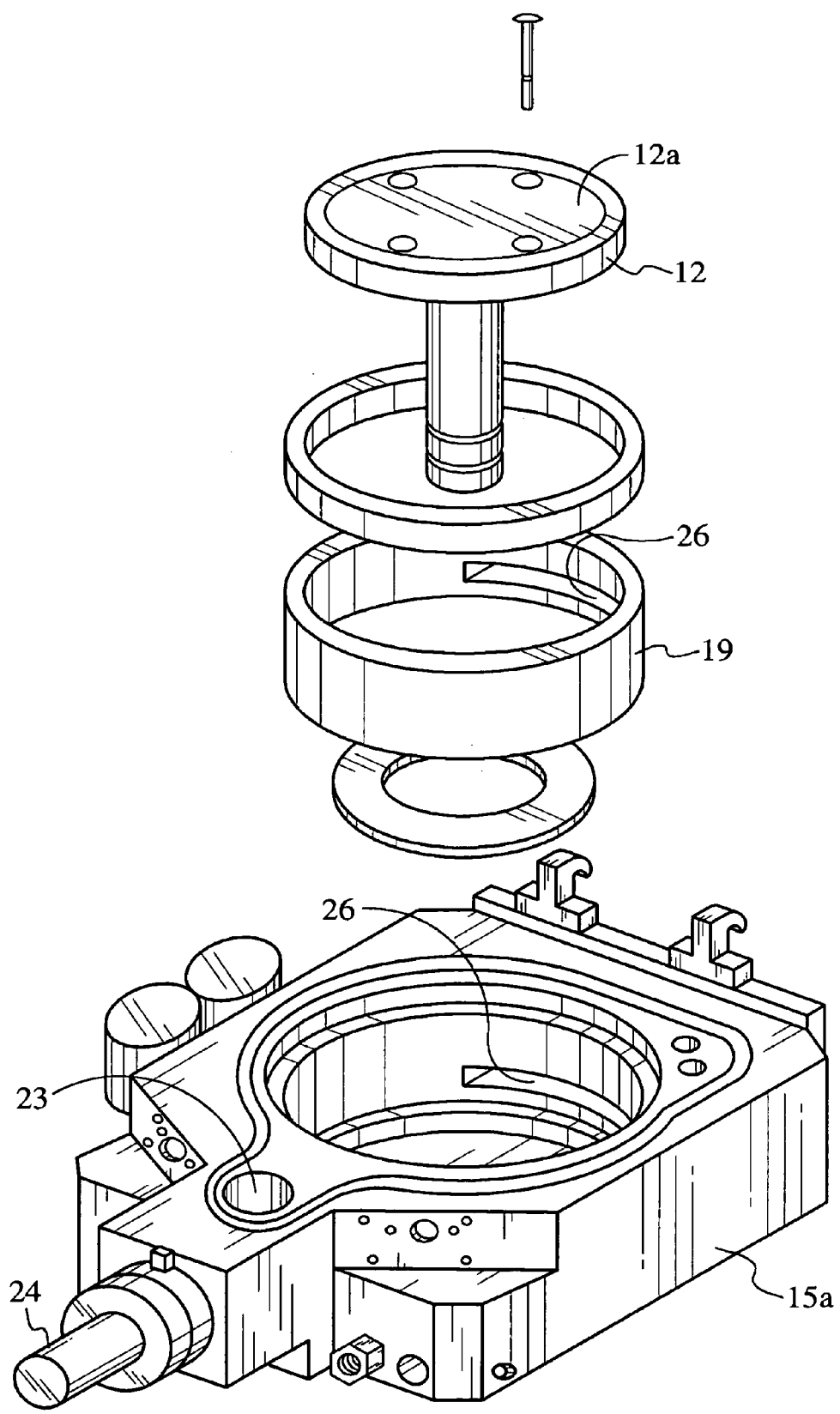
FIGS. 1C and 1D are exploded perspective views of parts of the CVD chamber depicted in FIG. 1A.
Figure 1D:
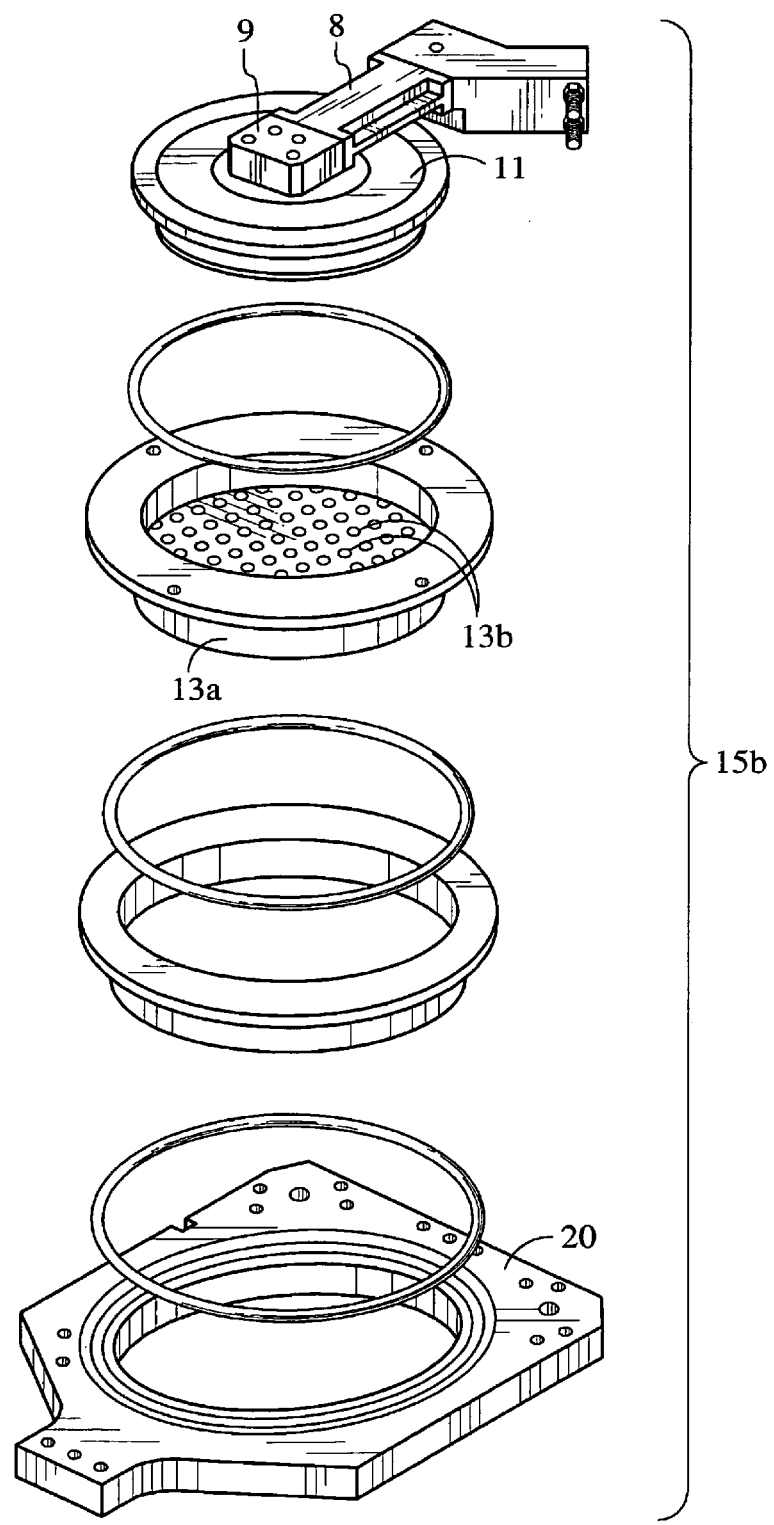

Specific embodiments of the present invention may be used with or retrofitted onto a variety of chemical vapor deposition (CVD) or other types of substrate processing apparatus. One suitable substrate processing apparatus with which the present invention can be used or retrofitted is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

Reactor 10 contains a gas distribution manifold 11 for dispersing process gases to a substrate (not shown) that rests on a resistively-heated pedestal 12 centered within the process chamber. During processing, the substrate (e.g. a semiconductor wafer) is positioned on a flat (or slightly convex) surface 12a of pedestal 12. Preferably having a surface of ceramic such as aluminum nitride, pedestal 12 can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes 13b (FIG. 1D) of a conventional flat, circular gas distribution face plate 13a. More specifically, deposition process gases flow (indicated by arrow 40 in FIG. 1B) into the chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 8 (FIG. 1B) into a gas mixing block or system 9 where they are combined and then sent to manifold 11. It is also possible, and desirable in some instances, to direct deposition and carrier gases directly from supply lines 8 to manifold 11. In such a case, gas mixing system 9 is bypassed. In other situations, any of gas lines 8 may bypass gas mixing system 9 and introduce gases through passages (not shown) in the bottom of chamber 12. As shown in FIG. 1B, there are three gas supply lines 8 in a specific embodiment to deposit $WSi_4$. A first line 8a supplies a silicon-containing gas (e.g., dichlorosilane ($SiH_2Cl_2$) referred to as "DCS" from a DCS source from gas source 7a) into gas mixing system 9, while a second line 8b supplies a tungsten-containing gas (e.g., tungsten hexafluoride ($WF_6$) from a $WF_6$ source from gas source 7b) into gas mixing system 9. For each line 8a and 8b, a carrier gas (e.g., argon from argon sources in gas sources 7a and 7b) can be supplied with the process to stabilize gas flows as appropriate and to even the gas flow between the two lines into mixing system 9. Such mixing of gases (DCS and $WF_6$) upstream of chamber 15 is believed to result in more uniform gas distribution into the chamber, thereby resulting in greater uniformity in the deposited $WSi_x$ film. A third supply line 8c introduces an inert purge gas (e.g., argon from a gas source 7c) from the bottom of the chamber to keep deposition gases away from the area of the chamber below heater 12. In some preferred embodiments, an additional silicon source (e.g., silane ($SiH_4$) from source 7a may be supplied to gas line 8a.

Generally, the supply line for each process gas includes (i) several safety shut-off valves (not shown) that can be used to automatically or manually shut off the flow of process gas into the chamber, and (ii) mass flow controllers (MFCs) (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma-enhanced process. In a plasma-enhanced process, an RF power supply 44 applies electrical power between the gas distribution faceplate 13a and pedestal 12 to excite the process gas mixture to form a plasma within the cylindrical region between the faceplate 13a and pedestal 12. (This region will be referred to herein as the "reaction region"). Constituents of the plasma react to deposit a desired film on the surface of the semiconductor wafer supported on pedestal 12. RF power supply 44 can be a mixed frequency RF power supply that typically supplies power at a high RF frequency (RF1) of 13.56 Megahertz (MHz) and at a low RF frequency (RF2) of 360 kilohertz (kHz) to enhance the decomposition of reactive species introduced into the vacuum chamber 15. Of course, RF power supply 44 can supply either single- or mixed-frequency RF power (or other desired variations) to manifold 11 to enhance the decomposition of reactive species introduced into chamber 15. In a thermal process, RF power supply 44 is not utilized, and the process gas mixture thermally reacts to deposit the desired film on the surface of the semiconductor wafer supported on pedestal 12, which is resistively heated to provide the thermal energy needed for the reaction.

During a plasma-enhanced deposition process, the plasma heats the entire reactor 10, including the walls of the chamber body 15a surrounding the exhaust passageway 23 and the shut-off valve 24. During a thermal deposition process, heated pedestal 12 causes heating of reactor 10. When the plasma is not turned on, or during a thermal deposition process, a hot liquid is circulated through the walls 15a of reactor 10 to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

The gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump 121 through a foreline 122 (see FIG. 1B).

The wafer support platter of resistively-heated pedestal 12 is heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of pedestal 12. Pedestal 12 may be made of material including aluminum, ceramic, or some combination thereof.

Typically, any or all of the chamber lining, gas inlet manifold faceplate, and various other reactor hardware are made out of material such as aluminum, anodized aluminum, or ceramic. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1A) raises and lowers the heater pedestal assembly 12 and its wafer lift pins 12b as wafers are transferred by a robot blade (not shown) into and out of the body of the chamber through an insertion/removal opening 26 in the side of the chamber 10. The motor 32 raises and lowers pedestal 12 between a processing position 14 and a lower wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and pedestal which are moved by appropriate motors controlled by controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, a floppy disk or other another appropriate drive, may also be used to operate controller 34.

Figure 1E:
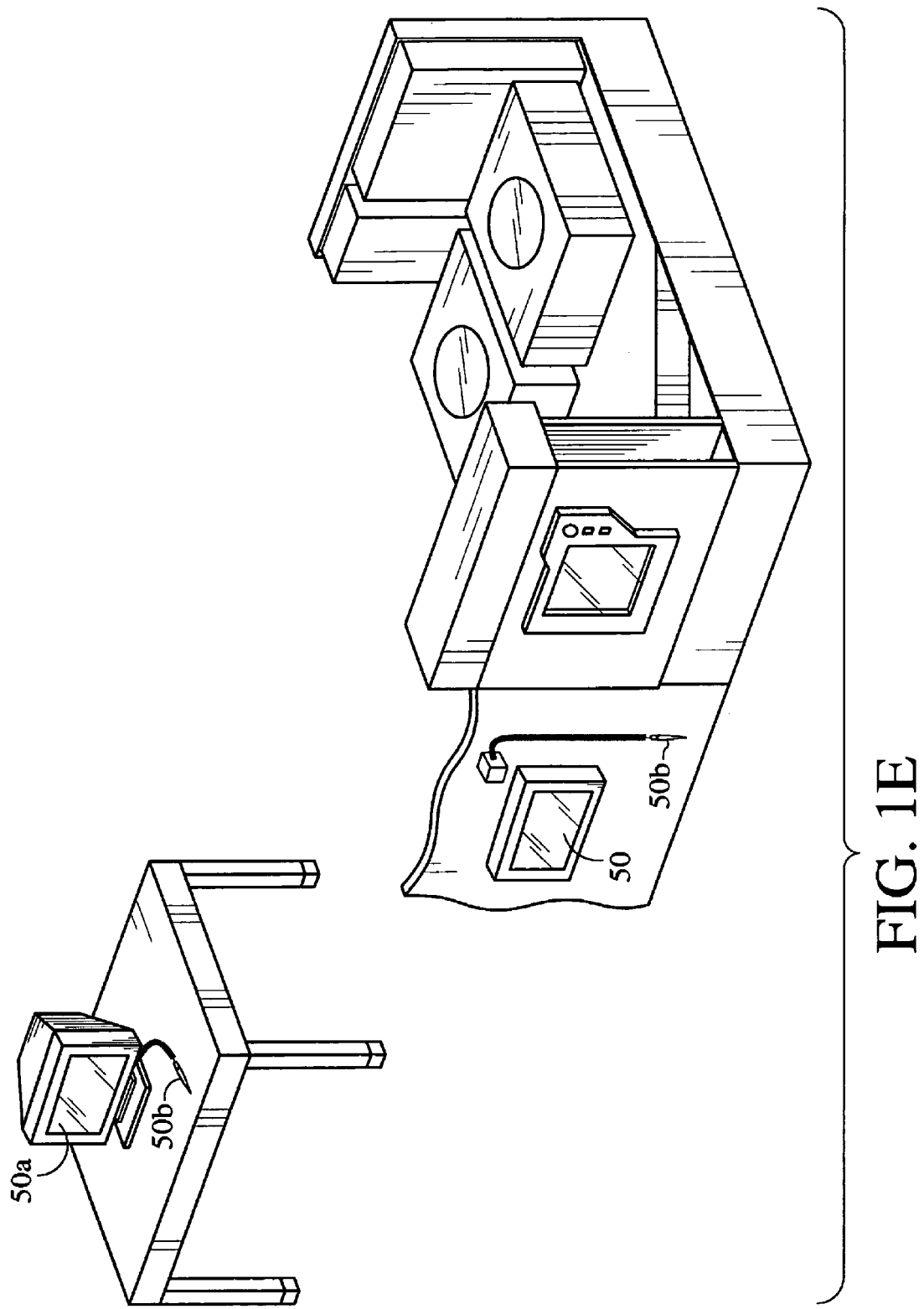
FIG. 1E is a simplified diagram of system monitor and CVD system 10 in a system which may include one or more chambers.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor and stored or embodied in a computer-usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1F:
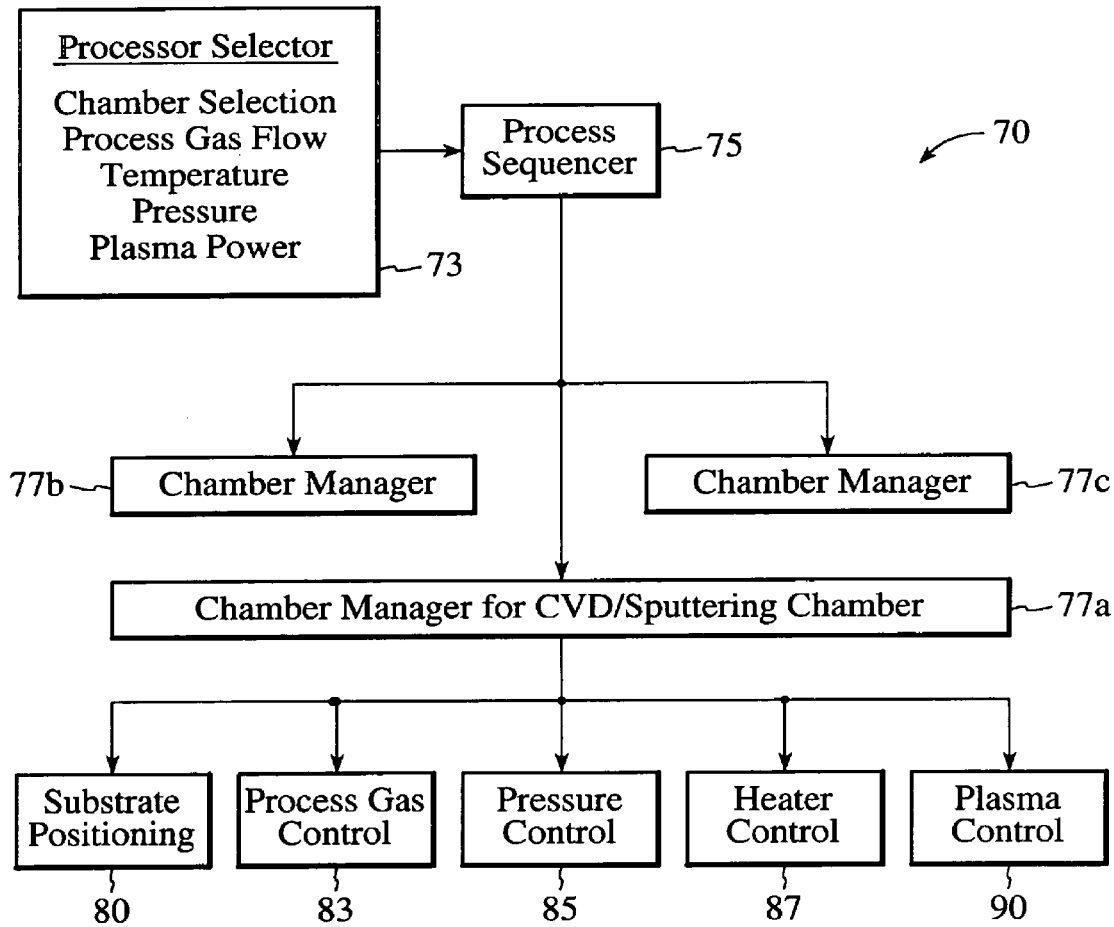
FIG. 1F shows an illustrative block diagram of the hierarchical control structure of the system control software, computer program 70, according to a specific embodiment.

FIG. 1F is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as microwave power levels or RF power levels and the low frequency RF frequency, cooling gas pressure, and chamber wall temperature. These parameters are provided to the user in the form of a recipe and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73 and for controlling operation of the various process chambers. Multiple users can enter process set numbers and process chamber numbers, or a user can enter multiple process set numbers and process chamber number, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a-c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed.next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, pedestal 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, if a process gas is to be vaporized from a liquid precursor, for example, tetraethylorthosilicate ("TEOS"), the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping set-point pressure for the exhaust system. When the pressure control subroutine 85 is invoked, the target pressure level is received as a parameter from the chamber manager subroutine 77a. The pressure control subroutine 85 operates to measure the pressure in the chamber 15 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in a pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Plasma control subroutine 90 also includes program code for turning on and setting/adjusting the power levels applied to the magnetron or other microwave source used in the present invention. Similarly to the previously described chamber component subroutines, the plasma control subroutine 90 is invoked by the chamber manager subroutine 77a.

The above reactor description is mainly for illustrative purposes, and other equipment such as electron cyclotron resonance (ECR) plasma CVD devices, induction coupled RF high density plasma CVD devices, or the like may be used with the present invention to provide upgraded apparatus. Additionally, variations of the above-described system, such as variations in pedestal design, heater design, RF power frequencies, location of RF power connections and others are possible. For example, the wafer could be supported and heated by quartz lamps. It should be recognized that the present invention is not necessarily limited to use with or retrofitting of any specific apparatus.

II. Exemplary Structures

Figure 2A:
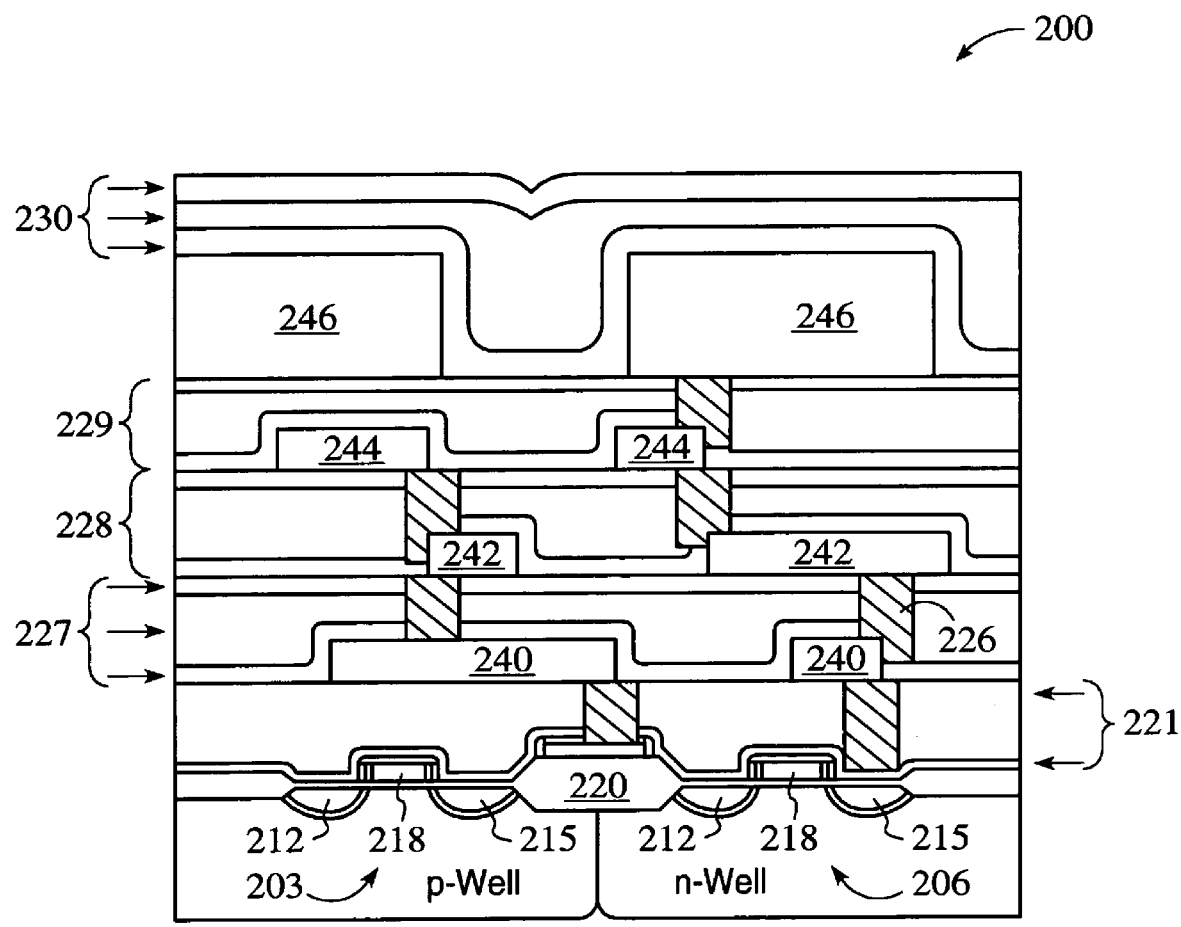
FIG. 2A is a simplified cross-sectional view of a semiconductor device manufactured in accordance with a specific embodiment of the present invention.

FIG. 2A illustrates a simplified cross-sectional view of an integrated circuit 200 which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective inter-metal dielectric (IMD) layers 227, 228, or 229. Adjacent metal layers are connected at selected openings by vias 226. Deposited over metal layer 246 are planarized passivation layers 230.

Figure 2B:
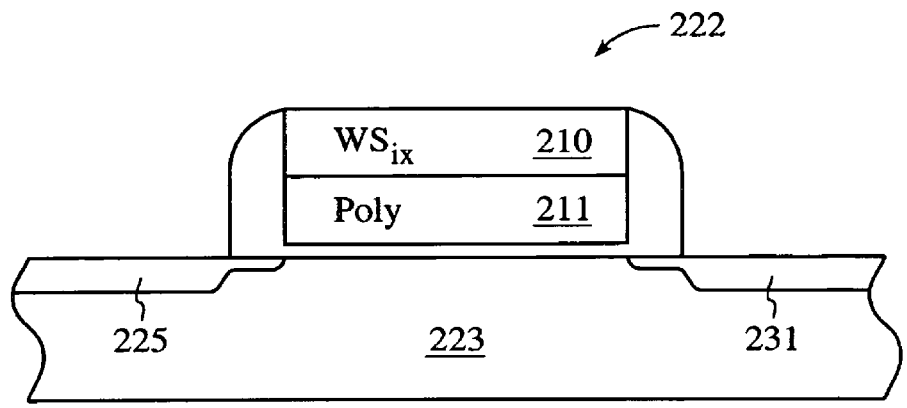
FIGS. 2B and 2C are simplified cross-sectional views of integrated circuit structures that incorporate $WSi_x$ layers in accordance with a specific embodiment of the present invention.
Figure 2C:
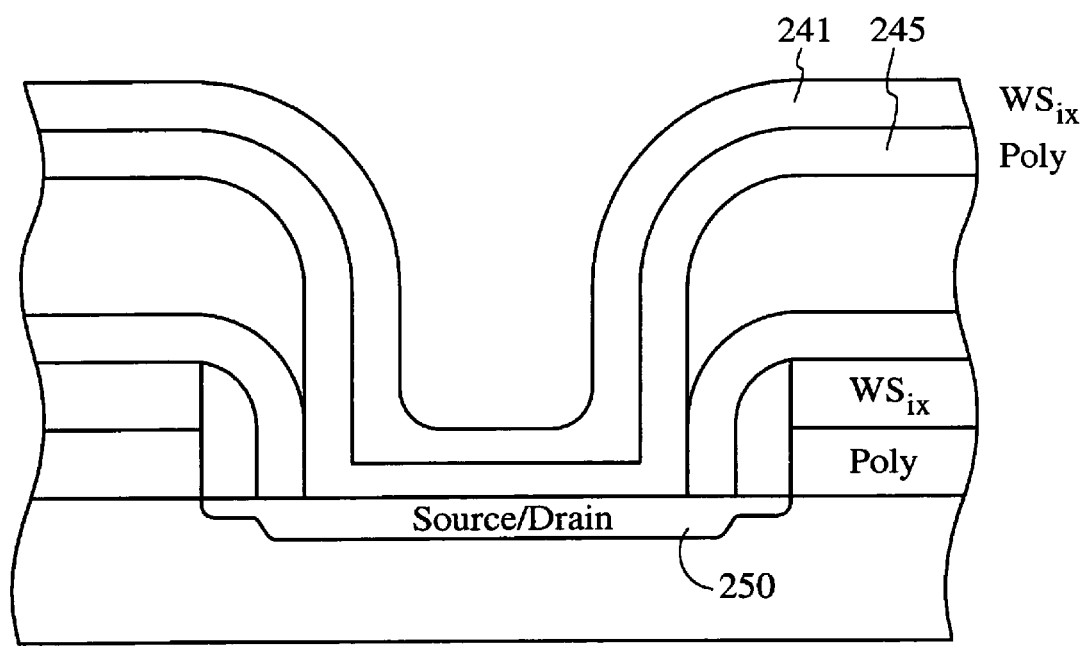

For gate metallizations in some applications, a low resistivity tungsten silicide ($WSi_x$) film is deposited on top of a layer of polycrystalline silicon (polysilicon), to form a layered structure called a "polycide" structure. Two examples of such polycide structures are shown in FIGS. 2B and 2C. As seen in FIG. 2B, a $WSi_x$ film 210 is deposited over a polysilicon film 211 to form a gate structure 222 that is part of a field effect transistor. The transistor is fabricated on a silicon substrate 223 and also includes source and drain regions 225 and 231. In FIG. 2C, a $WSi_x$ film 241 is deposited over a polysilicon layer 245 as part of a contact structure to source/drain region 250.

It should be understood that simplified integrated circuit 200 shown in FIG. 2A and structures shown in FIGS. 2B and 2C are for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to fabrication of PMOS, NMOS, CMOS, bipolar, or BiCMOS devices.

III. Remote Plasma Cleaning Source

Figure 3:
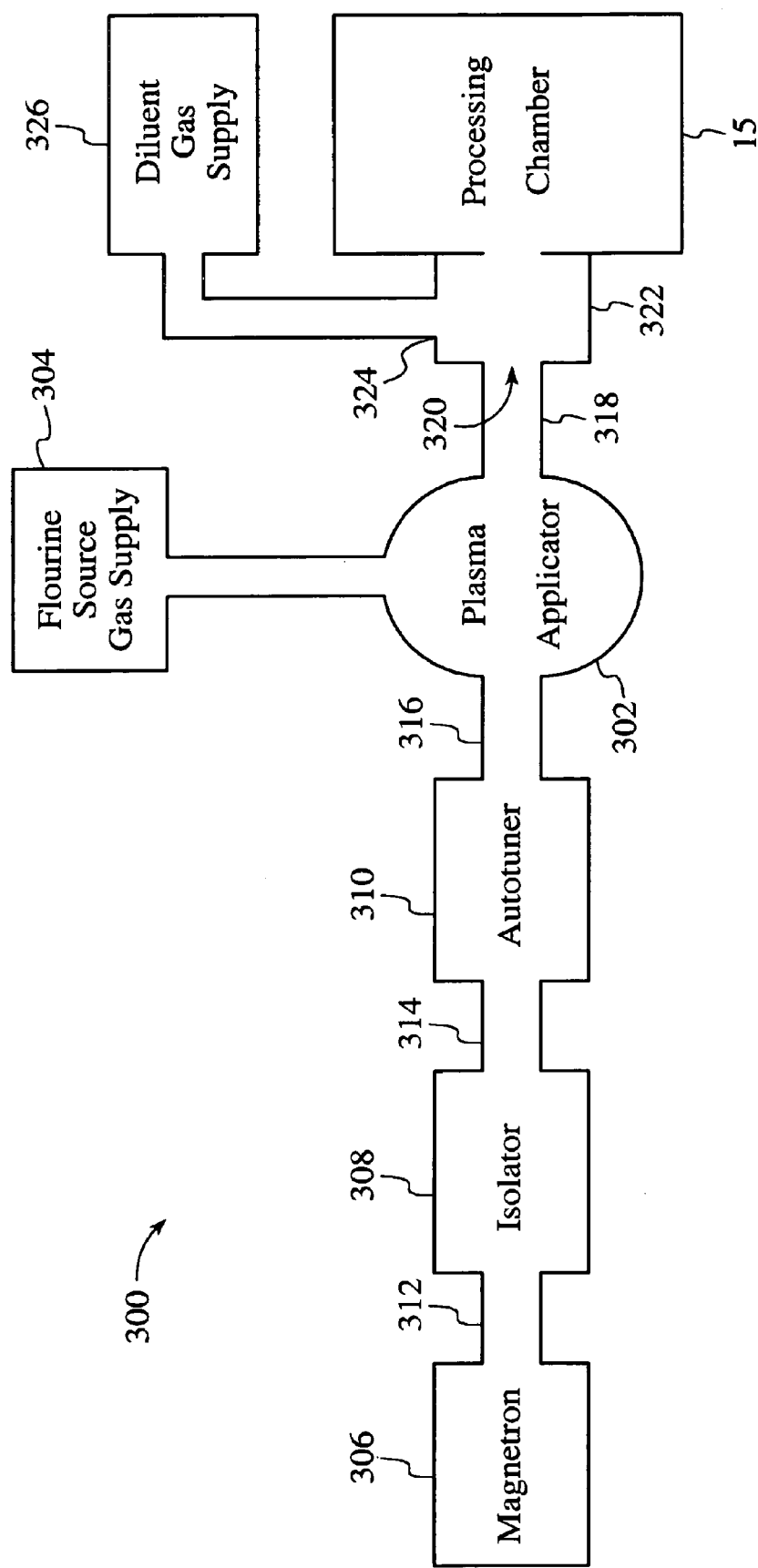
FIG. 3 is a simplified plan view of a remote microwave plasma source cleaning apparatus in accord with the present invention.

As discussed above, forming the integrated circuit described with respect to FIG. 2A results in unwanted deposition on any hot surface in the chamber, including the heater, process kit parts of the apparatus and the chamber walls. To remove the unwanted residue, a remote plasma source 300 shown in FIG. 3, is in fluid communication with the processing chamber 15. An exemplary plasma source includes a plasma applicator 302 in fluid communication with both a supply 304 of a fluorine-containing gas, such as nitrogen tri-fluoride ($NF_3$), and the processing chamber 15. A microwave generator, such as a magnetron 306, is in electrical communication with the plasma applicator 302 via an isolator 308 and an autotuner 310. Specifically, a first waveguide 312 is coupled between the magnetron 306 and the isolator 308; a second waveguide 314 is coupled between the autotuner 310 and the isolator 308; and a third waveguide is coupled between the autotuner 310 and the applicator 302. The microwave energy generated by the magnetron travel towards the applicator 302 by traversing waveguides 312, 314 and 316. The isolator 308 reduces the amount of microwave energy reflected into the magnetron 306. The autotuner 310 minimizes the microwave energy reflected by the applicator 302 back into the remaining components of the plasma source 300.

The reactive gas from supply 304 is flowed, under vacuum from the substrate processing chamber's pumping and exhaust system (not shown), into the plasma applicator 302 where microwave energy transmitted from the magnetron 306 form standing waves. The standing waves in applicator 302 ignite and maintain a plasma from the reactive gas, and a flow of reactive radicals, also under vacuum, is discharged from applicator 302, through output waveguide 318 and toward the processing chamber 15. The gas mixing system 9, shown in FIG. 1B includes a mixing manifold 322. One inlet 320 of the mixing manifold 322 is coupled between the output waveguide 318 and the applicator 302. The remaining inlet 324 of the mixing manifold 322 is coupled to receive a flow, under vacuum, of diluent gas from the diluent gas supply 326. The mixing manifold 322 includes an outlet 328 which is coupled to an inlet 330 of the processing chamber 15.

The mixing manifold 322 is provided so that a flow of diluent gas may be mixed with a flow of reactive radicals forming a homogeneous flow of a gas-radical mixture, anterior to the processing chamber 15. This produces a gas-radical mixture which allows increasing the flow rate of a gas mixture therethrough, while decreasing the rate at which materials located within the chamber are etched by the reactive radicals dispersed within the gas-radical mixture. With this gas-radical mixture, more than three times the number of wafers may be processed in the chamber 15 before a wet clean in necessitated. Employing the prior art remote plasma cleaning technique allowed approximately 3000 wafers to be processed before a wet clean was necessary. Flowing the aforementioned gas-radical mixture, by employing the mixing manifold 322, the number of wafers that may be processed between wet cleans is in excess of 10,000. This provides a substantial cost savings benefit in the manufacture of integrated circuits. Performing a wet clean on a process chamber necessitates down-time for the processing equipment. This translates into an increased per wafer cost of manufacture.

The increased throughput between wet cleans achievable by employing the gas-radical mixture according to the present invention is attributable to many factors. Firstly, it is believed that a reduction in the etch-rate provided by introducing the diluent gas into the reactive radical flow is dependent upon the material bombarded by the reactive radicals. For example, some components in the chamber 15, including the chamber walls, are typically formed from aluminum. Were the circuit 200, shown above in FIG. 2A, processed in the chamber 15, some of the chamber components, and portions of the chamber 15's walls, would be coated with a tungsten silicide ($WSi_x$) film. Typically, the fluorine atoms in the gas-radical mixture reacts with the tungsten silicide and the aluminum material to form $WF_6$, $SiF_4$ and $AlF_3$. The gas-radical mixture reduces the etch-rate of both the $WSi_x$ film and the Al components, but the reduction in the etch-rate of Al is greater than the reduction in the etch-rate of the ($WSi_x$) film. Therefore, although the overall time required to etch the ($WSi_x$) film increases, the reduction in the etch-rate of the Al compounds is sufficient to provide a net reduction in the etching of the chamber components and walls.

Secondly, the gas-radical mixture allows rapid removal of the $AlF_3$, during the plasma clean procedure, which forms on the surfaces of the chamber components and walls. This reduces the amount of accumulation of $AlF_3$ in the chamber 15 during a plasma clean, allowing a greater number of plasma cleans to be performed before a wet clean is necessitated. Specifically, the diluent gas is mixed with the flow of reactive radicals so that there is an increase in the flow rate of the gas-radical mixture through the chamber 15 without substantially increasing the net flux of the reactive-radicals therethrough during a plasma clean process. Thus, a greater quantity of $AlF_3$, as well as $WF_6$, $SiF_4$ may be removed from the chamber without substantially increasing the reactions between the reactive radicals and the chamber 15's components.

Figure 4:
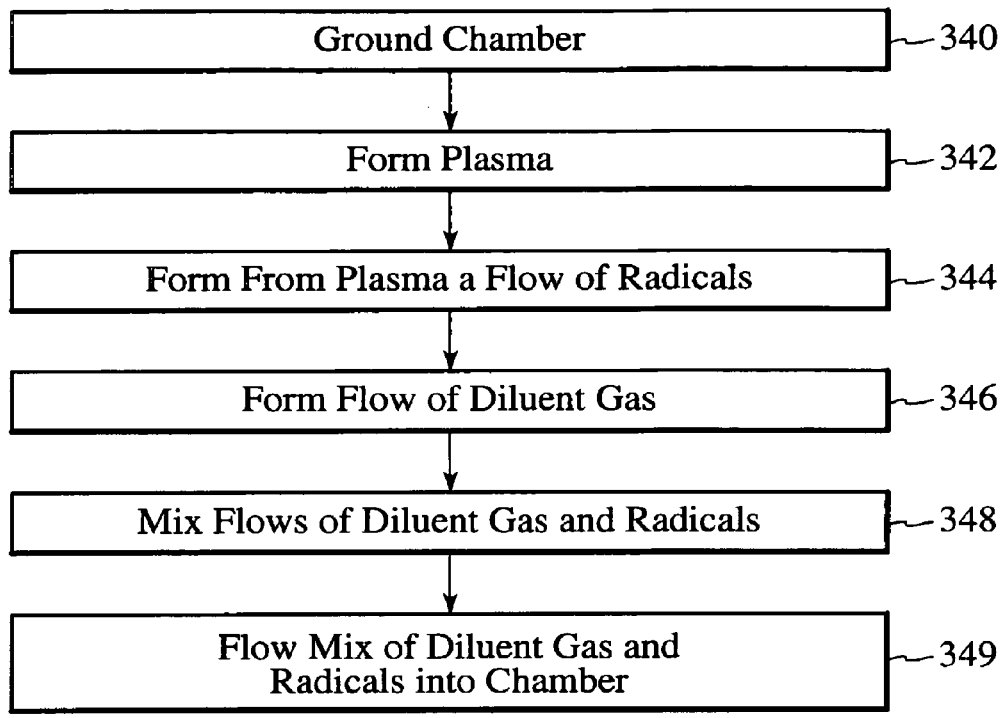
FIG. 4 is a flowchart illustrating the steps for performing a remote microwave plasma cleaning procedure in accord with the present invention.
Figure 5:
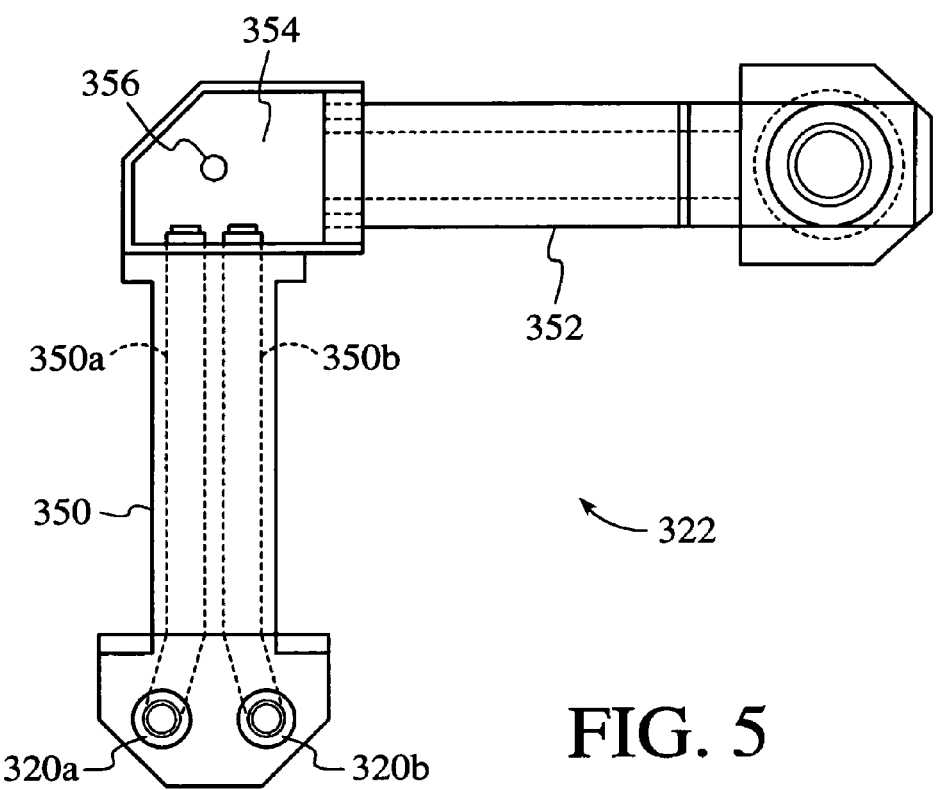
FIG. 5 is a detailed view of a mixing manifold shown above in FIG. 4.

Referring to FIGS. 3 and 4, during the plasma clean process, a grounding step 340 is performed in which the entire chamber 15 and the components therein are grounded to preclude ion bombardment of the same by preventing large electric fields from being present therein. At step 342, a plasma is formed in the applicator that includes a plurality of reactive radicals. Thereafter, at step 344, a flow is formed from the reactive radicals that moves towards the chamber 15. At step 346a flow of diluent gas is formed traveling from the diluent gas supply 326 toward the mixing manifold 322. The flow of reactive radicals intermixes with the flow of diluent gas, anterior to the chamber 15, when traveling through the mixing manifold 322 to form a gas-radical mixture. At step 348 the gas-radical mixture flows into the chamber 15 to remove deposition residue, as discussed above.

Referring to FIGS. 1A, 3 and 4, typically the flow rates of the diluent gas and reactive radicals into the mixing manifold 322 are such that the ratio of the diluent gas to reactive radicals in the gas-radical mixture entering the chamber 15 is at least 2:1. The flow rates of the respective gases are, however, dependent upon the size of the chamber 15, as well as the temperature and pressure therein. In an exemplary embodiment, the pedestal 12 is heated between 450 and 575° C., with 550° C. being preferred. The face plate 13a is heated between 50° C. and 100° C. and the chamber atmosphere is in the range of 35° C. to 55° C. At these temperatures, the flow rate of the reactive radicals, such as $NF_3$ is in the range of 200-400 sccm and the flow of diluent gas is in the range of 450 to 750 sccm, with the preferred flow rates being 300 and 700, respectively.

Referring to FIGS. 1A, 1B, 3 and 5, the chamber 15's pressure is typically below one torr in order to prevent premature recombination of the reactive radicals. To aide in the reduction of premature recombination, the mixing manifold 322 is distally positioned with respect to the plasma applicator 302 to reduce the back pressure that may occur in the plasma source 300. In this fashion, premature recombination of the reactive radicals is reduced. To that end, the mixing manifold 322 is positioned adjacent to the inlet manifold 11. The mixing manifold 322 includes two fluid paths 350 and 352 each of which extends from at least one inlet, terminating in a common mixing chamber 354, centered on the inlet manifold 11. Fluid path 350 extends from a pair of inlets 320a and 320b, transverse to fluid path 352. Fluid path 352 extends from inlet 320c. An outlet orifice 356 is formed into the mixing chamber 354 and coupled so as to place the same in fluid communication with an input port 358 of the inlet manifold 11. Fluid path 350 typically comprises of a pair of fluid conduits 350a and 350b each of which is uniquely associated with one of the inlets 320a and 320b and coupled to the supply of diluent gas (not shown) to allow the diluent gas to enter the mixing manifold 322. Fluid path 352, on the other hand, is a single conduit coupled to the output wave guide (not shown) to allow the reactive radicals to enter the mixing manifold 322. In this fashion, a homogenous gas-radical mixture of the diluent gas and the reactive radicals is formed in the mixing chamber 354 anterior to the chamber 15, e.g., before egressing through the outlet orifice 356.

Typically, the diluent gas is an inert gas, such as argon (AR). However, the diluent gas may be a reduction gas that will react with fluorine radicals in the chamber 15. For example, often fluorine radicals are present in the chamber subsequent to the removal of a substantial amount of the $WSi_x$ film. To reduce the amount of etching of the chamber components, the diluent gas may be provided with any compound that reacts with fluorine. An example of a reduction diluent gas is $H_2$ which reacts with fluorine to form HF. Although the reactive gas employed to form the plasma has been described being ($NF_3$), it should be understood that other fluorine-containing gases may be employed, such as carbon tetrafluoride ($CF_4$) sulfur hexafluoride ($SF_6$) or similar gases. In addition, chlorine-containing gases also may be used in lieu of a fluorine containing gas. In such a case the reduction gas includes a compound that is reactive with chlorine.

IV. Exemplary Embodiment of a Remote Plasma Cleaning Source

Figure 6:
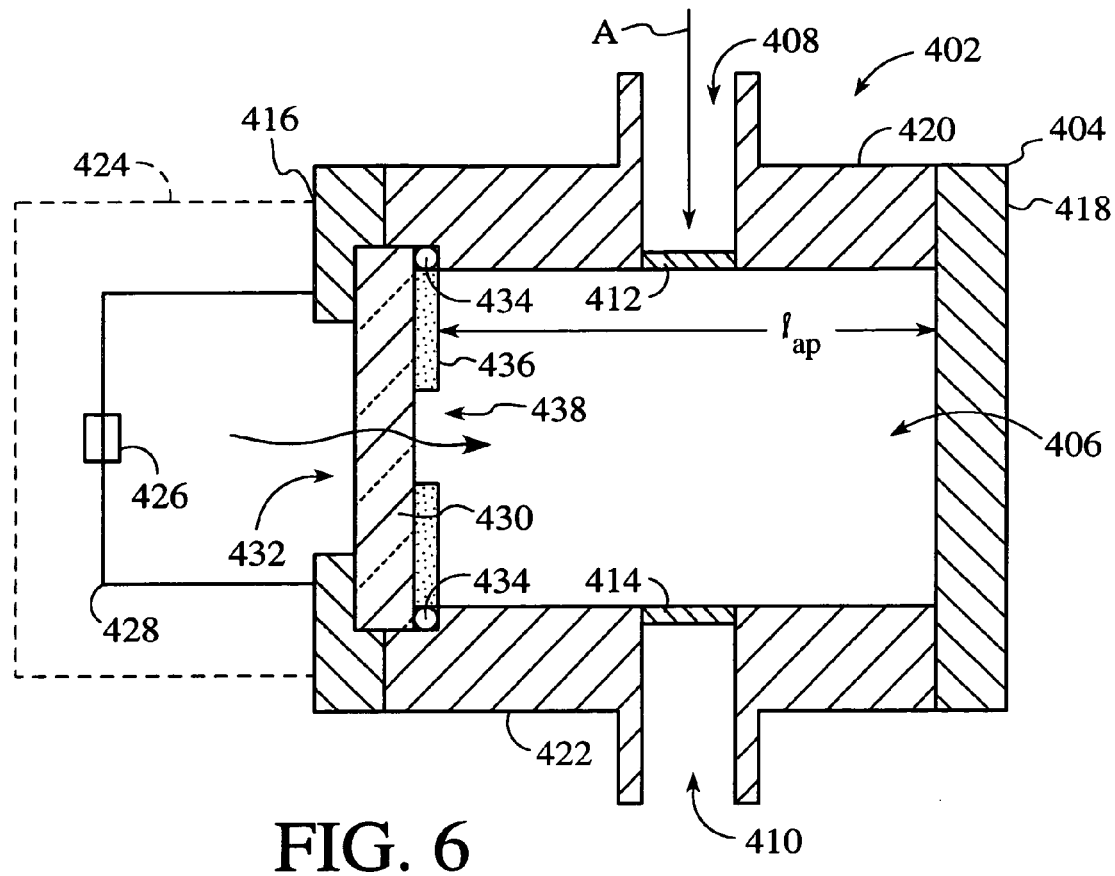
FIG. 6 is a cross-sectional side lengthwise view of a remote microwave plasma source module according to a specific embodiment of the present invention.

Referring to FIG. 6, although any plasma applicator 302 may be used, in one embodiment plasma applicator 402 includes body 404 defining a volume 406 of desired shape. A fluid inlet 408 is disposed opposite to a fluid outlet 410 so that a fluorine-containing reactive gas may pass therebetween. Positioned at the juncture between the volume 406 and the fluid inlet 408 is a first microwave arrestor 412. Similarly, at the juncture between the fluid outlet and the volume 406 is a second microwave arrestor 414. The arrestors 412 and 414 prevent egression of the microwave plasma from volume 406 and are preferably comprised of grids, or metal plates having a plurality of throughways. For example, arrestors 412 and 414 may be formed from aluminum plates having a thickness ranging from about 0.05-0.25 inch, preferably about 0.14 inch, with small holes therethrough, each of which has a diameter of about 0.125 inch or less. The center-to-center hole separation ranges from about 0.1-0.4 inch, preferably about 0.31 inch. This design prevents the escape of microwave energy having a frequency of about 2.45 GHz from escaping the applicator 402, thereby preventing a plasma present therein from traversing through either the fluid inlet 408 or fluid outlet 410. The aforementioned holes allow the reactive gases to enter into, and radicals to exit from, the applicator 402.

The plasma applicator 402 also includes a first and second spaced-apart end walls 416 and 418 with two spaced-apart side walls 420 and 422 extending between the first and second end walls 416 and 418. The fluid inlet is formed into the first side wall 420, and the fluid outlet 410 is formed into the second side wall 422. Typically, the walls 416, 418 and 420 are made from aluminum, but other materials may be employed, including copper, stainless steel and the like. A microwave generator, such as a magnetron 424 is in electrical communication with the first end wall 416 via an antenna 426 coupled to a waveguide system 428 to transmit microwave energy into the volume 406. The magnetron is typically a CW microwave source providing microwaves at about 2.45 GHz and between about 75 Watts (W) to about 1 kW of microwave power. The antenna may be any known antenna in the art suitable for microwave transmission, including a stub antenna, a slot antenna or the like. The antenna is position to optimize the transfer of microwave energy into the waveguide 428 and is typically about one quarter-wavelength away from one end of waveguide system 428.

The waveguide system 428 may include more than one waveguide sections and tuning elements, which are well known to one of ordinary skill in the art. Typically, the waveguide system 428 may be a section of rectangular cross-sectional waveguide, but waveguides having other cross-sectional dimensions (e.g., circular) may be used in other embodiments. The waveguide system 428 may have any desired length with a waveguide width of about 3.4 inches and a waveguide height of about 1.7 inches. Part of waveguide system 428 is adjacent to microwave source 424 at one end and adjacent to plasma applicator 402 at its other end. Waveguide system 428 may also optionally include other optimizing features, such as directional couplers or a phase detector to monitor reflected power and/or an
isolator with a load to absorb any reflected microwave power that could otherwise damage the magnetron.

To facilitate transfer of microwave energy from the waveguide system 428 to the volume 406, the first end wall 416 may include a microwave-transparent plate 430 and an aperture 432 extending between the waveguide 428 and the plate 430. The microwave-transparent plate 430 may be from any material that is transparent to microwaves, such as alumina ($Al_2O_3$) in either ceramic or sapphire form, depending upon the application. $Al_2O_3$ in sapphire form is most preferred in some specific embodiments. In specific embodiments, plate 430 has dimensions greater than the transverse dimensions of the volume 406, and the dimensions of the aperture 432 substantially correspond to the cross-sectional dimensions of waveguide system 428. The thickness of microwave-transparent plate 430 is chosen in order to optimize the operational life while maximizing microwave power transfer. Typically, the thickness of microwave-transparent plate 430 ranges from about 0.25-0.75 inch, with about 0.4 inch being the preferred thickness.

Fluid-tight integrity of the volume 406 should be maintained. To that end, the components plasma applicator 402 may be coupled together by any method known in the art to provide fluid-tight seals. For example, brazing, welding, or fastening mechanisms, such as screws may be employed to connect the first and second end walls 416 and 418 to side walls 420 and 422. Typically, the second end wall 418 is removably attached to side walls 420 and 422 to facilitate cleaning of the volume 406 via physically wiping the same with a special cloth and cleaning liquids. To that end, bolts (not shown) may be employed to couple the second end wall 418 to the side walls 420 and 422. Fluid-tight integrity may be maintained by disposing sealing members therebetween, such as sealing member 434, which is disposed between the microwave-transparent plate 430 and first and second side walls 420 and 422. Any type of sealing member may be employed, including a buna-rubber O-ring, and/or gaskets made from metal, such as aluminum, or of Teflon™ or other appropriate material impervious to microwaves.

Figure 7:
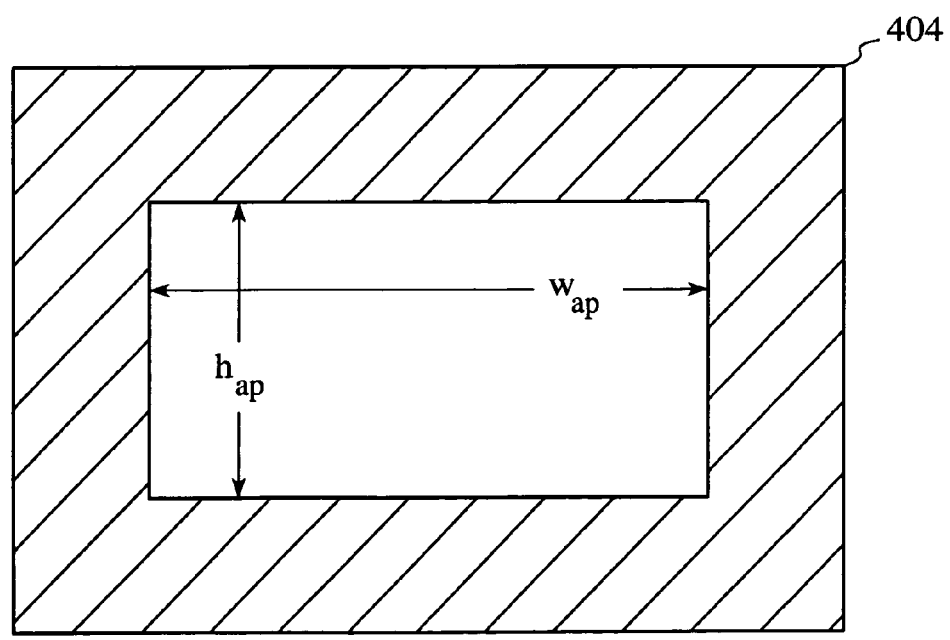
FIG. 7 is a cross-sectional side transverse plan view shown in FIG. 6, taken along lines A-A of an exemplary embodiment of a plasma source module shown in FIG. 3.

Referring to FIGS. 6 and 7, the volume is shown as having a rectangular cross-section in two orthogonal planes, both of which extend parallel to flow path A. The dimensions of the walls 416, 418, 420 and 422 are selected so that the volume has dimensions, e.g., length ($l_{AP}$), width ($w_{AP}$) and height ($h_{AP}$), necessary to achieve the desired resonance mode of the microwave energy. Typically the dimensions of the volume 406 are established to obtain one of the $TF_{10n}$ resonance modes, where n is an integer. In addition, the dimensions of the volume 406 may be established to minimize the microwave energy reflected by the plasma. To adjust the dimensions of the volume 406, a metal plate 436 may be disposed adjacent to the microwave-transparent plate 430 so as to face the volume 406. The metal plate 436 may be a metal foil or a sputtered or otherwise deposited metal layer on microwave-transparent plate 430. The metal plate may include a centrally located aperture 438 to guide microwaves into the volume 406.

Figure 8:
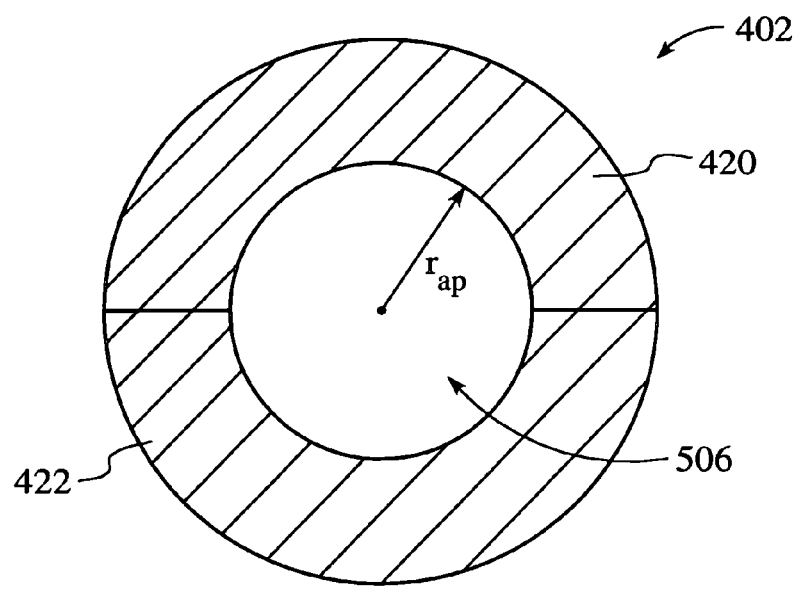
FIG. 8 is a cross-sectional side transverse plane view along line A-A of another embodiment of the remote microwave plasma source shown in FIG. 3.

Referring to FIGS. 6 and 8, the side-walls 420 and 422 may define a cylindrical volume 506, having an applicator length ($l_{AP}$) and a radius ($r_{AP}$), with $l_{AP}$ and $r_{AP}$ chosen to excite one of the $TE_{11n}$ resonance modes (where n is an integer). The dimensions of $l_{AP}$ and $r_{AP}$ may range from about 2-4 inches and about 1.5-5 inches, respectively, depending upon the resonance mode desired. For example, to obtain the $TE_{111}$ resonance mode, $l_{AP}$ and $r_{AP}$ are established to be approximately 3.67 inches and 2 inches, respectively. Preferably, the volume has dimensions to excite the $TE_{111}$ resonance mode of the microwaves.

Figure 9:
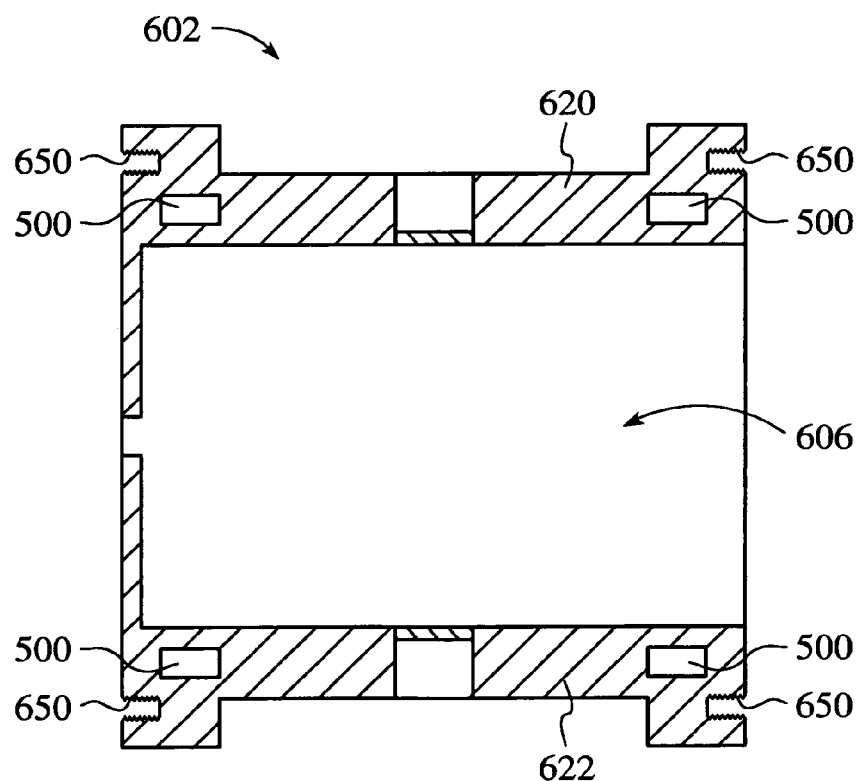
FIG. 9 is an alternate embodiment of a plasma applicator show in FIG. 6.

Referring to FIG. 9, the plasma applicator 602 is shown as having passages 500 disposed at opposite ends of the volume 606 and are complementary to the shape of the first and second sidewalls 620 and 622. In an exemplary embodiment, the first and second side walls 620 and 622 define a cylindrical volume 606, and the passages 500 have an annular shape. The thickness of the first and second sidewalls 620 and 622 range from about 0.05 inch to 0.25 inch, preferably about 0.14 inch, separating passages 500 from the volume 606. The passages 500 are built into the sidewalls 620 and 622 to provide a path through which a flow of coolant may be placed in thermal communication with the volume 606. The cross-sectional dimensions of each passage 500 from about 0.1-1 inch in length, with 0.53 inch being preferred, to about 0.1-1 inch in height, with about 0.4 inch being preferred. To that end, the total thickness of each of the applicator body 320 ranges from about 0.2-3 inches, preferably about 1 inch, so that applicator body 320 meets strength requirements and heat transfer passages 500 are accommodated. Cooling the volume 606 in this manner facilitates transport of radicals to the downstream mixing manifold (not shown). For example, when using a fluorine-containing reactive gas such as $NF_3$ to form the plasma in applicator, the reactive gas reacts with materials from which it is composed, typically of aluminum. This results in the formation of aluminum fluoride (AlF) in the volume 606. Aluminum fluoride forms at rates on the order of μms per minute in remote plasma systems reaching temperatures of about 400° C. Flowing various coolants, such as water, water-based ethylene glycol, or oil-based thermal transfer fluids, through passages 500, allows the volume 606 temperature to be maintained at a predetermined temperature ranging from about 0-100° C. At these temperatures, it is believed that AlF forms at significantly slower rates on the order of μms per year. In one experiment, the use of water, for example, at about 20-25° C., circulating through heat exchange passages 500 at a rate of at least about 2 liters/minute, preferably about 3 liters/minute, can maintain the volume 606 at temperatures as low as room temperature (approximately 25° C.). As another experiment, water at temperatures lower than about 20° C., flowing at about 3 liters/minute, maintained the volume 606 at temperatures lower than approximately 25° C. The cooling properties provided by the passages 500 coolant flow therethrough also result in lowering of the temperature of the microwave-transparent plate (not shown) via conduction with the side walls 620 and 622. This reduces the probability of cracking of the plate 436 due to thermal shock.

Figure 10:
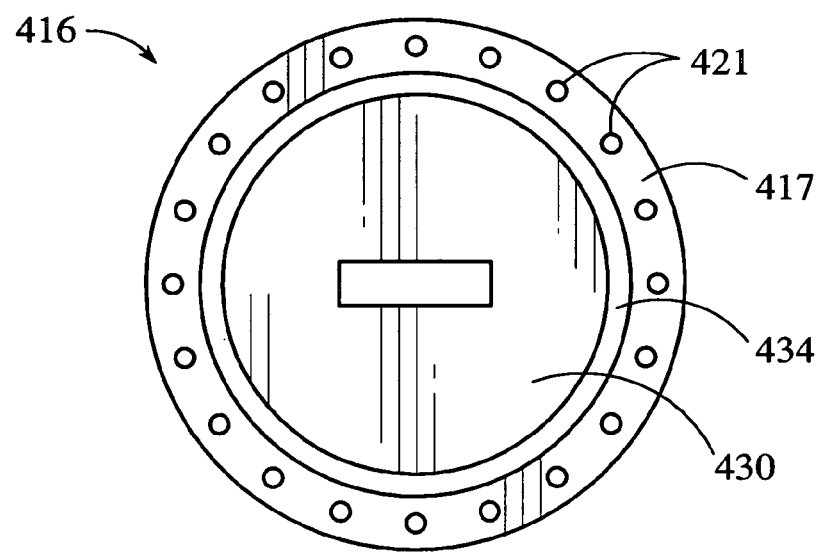
FIG. 10 is a plan view of an alternate embodiment of a first end wall shown above in FIG. 6.
Figure 11:
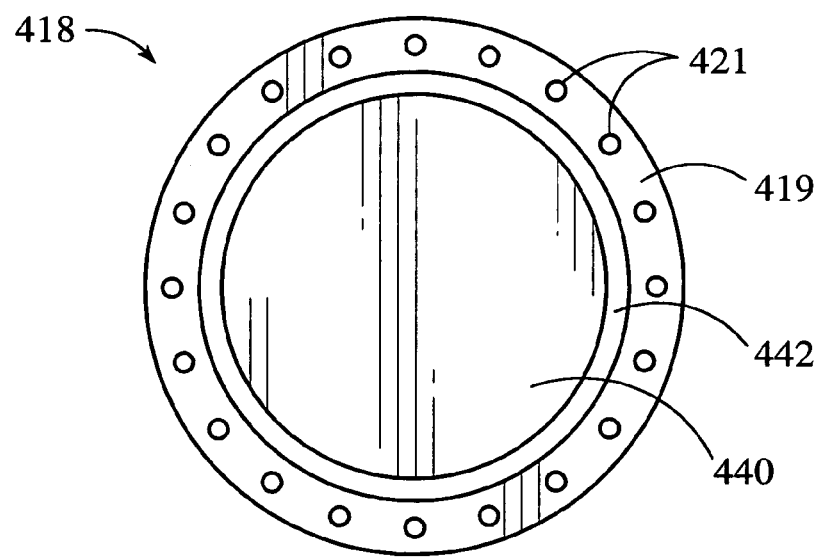
FIG. 11 is a plan view of an alternate embodiment of a second end wall shown above in FIG. 6.

Referring to FIGS. 9, 10 and 11, a plurality of equally spaced threaded bores 650 are disposed about the circumference of the opposed ends of the plasma applicator 602 to facilitate removably attaching the first and second end walls 416 and 422. Specifically, the first end wall 416 is shown as being circular with the an outer region 417 having a plurality of blind holes 421 which are adapted to align with the plurality of threaded bores 650, when placed in a final seating position. Similarly, the second end wall 418 also includes an outer region 419 having a plurality of blind holes 421 which align with the plurality of thread bores 650. In this fashion, a plurality of screws (not shown) may be employed to rigidly attach the first and second end walls 416 and 418 to the side walls 420 and 422.

To facilitate formation of a fluid-tight seal, an annular sealing member 434 is disposed about the circular transparent-microwave plate 436 in the first end wall 416. The sealing member 434 has a radius slightly less than the radius of the microwave transparent-plate 430, preferably about 2.25 inches. The radius of the microwave transparent-plate 430 ranges from about 1-5 inches, with about 2.5 being preferred. Having a thickness ranging from about 0.001-0.25 inch, preferably about 0.125 inch, metal sheet 436 has a thickness optimized to provide good thermal contact to transfer heat from the microwave-transparent plate 430. This reduces thermal shock and, therefore, arcing. The aperture 438 has a rectangular shape with a width ($w_A$) of about 2.41 inches and a height ($h_A$) of about 0.38 inch. However, aperture 438 may have any shape and dimensions desired, depending upon the application.

Similar to the first end wall 416, the second end wall 418 has a circular shape with an annular groove 440 formed therein. The annular groove 440 surrounds a portion of the first end wall having a cross section matching a cross section of the volume 606. A sealing member, such as an O-ring 442 is disposed in the groove 440 to facilitate formation of a fluid-tight seal between the first and second side walls 420 and 422 and the second end wall 418.

Referring again to FIG. 3, although plasma source 300 has been described as using a magnetron 306 as the source for microwave energy any type of microwave generators may be employed. For example, an inexpensive pulsed, low wattage power supply to generate between about 1-1.5 kW microwave power from the magnetron, or a high wattage, continuous wave (CW) power supply to generate typically up to about 2.5-6 kW microwave power from the magnetron. In some preferred embodiments, magnetron 305 may be the type of magnetron employed in some microwave ovens and be powered by a low cost, low wattage, pulsed 60 Hertz (Hz) half-rectified power source (which contains large ripples) to provide microwaves having a frequency of about 2.45 Gigahertz (GHz). Such pulsed, low wattage microwave generators can be at least two orders of magnitude lower in price than a high power CW microwave generator or an RF generator.

The waveguides 312, 314, 316 may be any type known in the art, and may be made of aluminum, copper, stainless steel, and the like. The dimensions of the waveguides 312, 314, 316 are that needed to merely transmit microwave energy to plasma applicator 302 without selectively guiding particular modes, according to the specific embodiment.

The RF isolator is typically made of a material that provides RF isolation, such as polytetrafluoroethylene (PTFE), and which is resistant to etching or deposition by radicals (such as fluorine radicals when forming the plasma using a fluorine-containing gas like $NF_3$). In addition to PTFE (commercially available, for example, as Teflon™ PTFE), any fluorinated material including fluorinated polymers such as PFA (which is a polymer combining the carbon-fluorine backbone of polytetrafluoroethylene resins with a perfluoroalkoxy side chain), fluorinated ethylene-propylene (TFE), or the like, also may be used. Of course, other materials may be used that are resistant to the particular reactive chemistry used.

In the present invention, reactive gases that are supplied to applicator designs discussed above with respect to FIGS. 6-11 can be ignited using fairly low microwave power to form a plasma sustained by the standing waves formed therein. For example, as low as about 250 W of microwave power may be provided to strike a plasma, in contrast to conventional microwave plasma systems where a UV lamp or a high microwave power levels on the order of 3 kW are required to strike plasma. Therefore, by employing the applicators discussed above, a plasma may be formed without the use of a plasma-enhancing gas like argon and without a UV lamp, thereby decreasing the unit cost of the applicator. Advantageously, microwaves resonating in the plasma applicator are able to energize reactive gases in the entire volume of plasma applicator for efficient microwave energy usage and effective plasma ignition, compared to conventional remote microwave plasma systems where a small volume in a plasma applicator tube (disposed through a small portion of waveguide) contains the plasma.

The above-described gas flow, chamber pressure and temperature ranges provide for cleaning procedures that are sufficient to remove undesired residues such as tungsten silicide residues that may be built up over time after processing multiple wafers or substrates. The parameters in the above processes should not be considered limiting to the claims. Other oxide, nitride or metal-containing residues may be cleaned using the present invention in substrate processing apparatus depositing other types of films besides tungsten silicide. The actual values (temperature, pressure, gas flows, etc.) selected for a particular cleaning recipe will vary according to various applications. Also, flow values mentioned above are for a plasma applicator used with a DCSxZ chamber (equipped for a 200-mm wafer and with a total volume of about 7 liters) manufactured by Applied Materials, but flow values would differ depending on the type or size of chamber used. To that end, the rate at which the reactant gas is introduced into applicator may be controlled by system controller of CVD system 10 through a valve or MFC in the gas feed line. The reactant gas initially may flow into the applicator without application of power to the magnetron to provide gas flow stabilization. This gas flow stabilization may last about 0.25-10 seconds, preferably about one second, in a specific embodiment before powering the magnetron. Then, fluorine radicals (and possibly also $NF_3$) from the plasma created in the applicator of the remote module flow from an outlet downstream into the substrate processing chamber to efficiently and gently clean the residues in the processing chamber. The selected processing chamber pressure to provide the internal applicator pressure is set and maintained throughout the cleaning by a throttle valve in conjunction with the vacuum pump system of the substrate processing chamber. The throttle valve and the vacuum pump system are all controlled by system controller in setting and maintaining the selected pressure. After being set, processing conditions are maintained by system controller for a selected time period ranging from about 50-1000 seconds, preferably ranging from about 150-500 seconds, and most preferably about 340 seconds, for the entire cleaning procedure. Once the magnetron is powered down after the cleaning is complete, the pressure may be allowed to stabilize for about 0.25-10 seconds, preferably about 5 seconds, before bringing the pressure to the desired level for the subsequent process step to occur in the chamber.

It is to be understood that the above description is intended to be illustrative and not restrictive. Many embodiments will be apparent to those of skill in the art upon reviewing the above description. By way of example, the inventions herein have been illustrated primarily with regard to a cleaning apparatus, but they are not so limited. Those skilled in the art will recognize other equivalent or alternative methods of depositing or etching various layers while remaining within the scope of the claims of the present invention. The scope of the inventions should, therefore, be determined not with reference to the above description, but should instead be determined with reference to the appended claims, along with the full scope of equivalents to which such claims are entitled.

What is claimed is:

1. A method of removing residue from a substrate processing chamber, said method comprising the steps of:
    forming a plasma remotely with respect to said chamber, said plasma including a plurality of reactive radicals;
    forming a flow of said reactive radicals traversing toward said chamber;
    forming a nonplasma diluent gas flow, wherein said nonplasma diluent gas flow comprises at least one of an inert gas or a reduction gas;
    mixing said flow of said reactive radicals and said diluent gas flow at a mixing location downstream of a location of forming said flow of said reactive radicals and anterior to said chamber to form a gas-radical mixture; and
    flowing said gas-radical mixture into said chamber to remove residue from within said chamber,
    wherein each step of the method occurs without a wafer in said chamber.

2. The method as recited in claim 1 wherein said flow of reactive radicals and said gas flow are established to maintain a pressure within said chamber below one torr.

3. The method as recited in claim 1 wherein said reactive radicals comprise atoms associated with a reactive gas, with said reactive gas being selected from a group consisting of $NF_3$, dilute $F_2$, $CF_4$, $C_2F_6$, $C_3F_8$, $SF_6$, and $ClF_3$.

4. The method as recited in claim 1 wherein said chamber has components therein, with a subset of said radicals in said gas-radical mixture reacting with said components creating a residue and further including the step of exhausting said residue, with a rate at which said residue is exhausted depending upon a rate of said diluent gas flow.

5. The method as recited in claim 1 wherein said diluent gas flow travels at a first rate and said flow of said reactive radicals travel at a second rate with a ratio of said first rate to said second rate being at least 2:1.

\* \* \* \* \*